US008735802B2

United States Patent
Iwanaga

(10) Patent No.: US 8,735,802 B2
(45) Date of Patent: May 27, 2014

(54) OPTICAL TRANSMISSION DEVICE, OPTICAL TRANSMISSION/RECEPTION DEVICE, CONTROL METHOD, AND CONTROL PROGRAM HAVING HEATING AND COOLING CONTROL FUNCTIONS OF A TEMPERATURE CONTROL ELEMENT

(75) Inventor: Kohei Iwanaga, Tokyo (JP)

(73) Assignee: NEC Corporation, Tokyo (JP)

( * ) Notice: Subject to any disclaimer, the term of this patent is extended or adjusted under 35 U.S.C. 154(b) by 291 days.

(21) Appl. No.: 13/368,543

(22) Filed: Feb. 8, 2012

(65) Prior Publication Data

US 2012/0205526 A1 Aug. 16, 2012

(30) Foreign Application Priority Data

Feb. 15, 2011 (JP) ................. 2011-030229

(51) Int. Cl.
*H01J 40/14* (2006.01)
(52) U.S. Cl.
USPC ......................................... 250/238; 250/205
(58) Field of Classification Search
USPC ............... 250/238, 239, 205, 214 R; 372/34, 372/29.01, 29.02, 38.01, 29
See application file for complete search history.

(56) References Cited

U.S. PATENT DOCUMENTS 8,208,507 B2 * 6/2012 Lerner et al. .................... 372/34

FOREIGN PATENT DOCUMENTS

| JP | 11-126989 A | 5/1999 |
| JP | 2004296988 A | 10/2004 |
| JP | 2009081512 A | 4/2009 |

OTHER PUBLICATIONS

W. Kobayashi et al., "Low Power Consumpton 1.55 μm EADFB Laser", NTT Photonics Laboratories, NTT Technical Review, vol. 22, No. 11, Nov. 2010, pp. 69-73.

* cited by examiner

*Primary Examiner* — Que T Le
(74) *Attorney, Agent, or Firm* — Sughrue Mion, PLLC

(57) ABSTRACT

For an optical transmitter in which an EA modulator modulates a laser beam emitted from an LD, a control circuit stops heating/cooling of the EA modulator when a casing temperature (TC) is within a range of a low-temperature side reference temperature (T_cool) and a high-temperature side reference temperature (T_heat), sets a bias voltage for the EA modulator to a bias voltage corresponding to the modulator temperature based on table information recorded on a memory circuit, heats the EA modulator and sets the bias voltage corresponding to the low-temperature side reference temperature when the casing temperature is equal to or lower than the low-temperature side reference temperature, and cools the EA modulator and sets the bias voltage corresponding to the high-temperature side reference temperature when the casing temperature is equal to or higher than the high-temperature side reference temperature.

11 Claims, 9 Drawing Sheets

GRAPH SHOWING RELATION BETWEEN CASING TEMPERATURE
AND EA MODULATOR TEMPERATURE

TABLE INFORMATION RECORDED ON MEMORY CIRCUIT

FIG. 7

| EA MODULATOR TEMPERATURE(TEA) | EA BIAS VOLTAGE SETTING VALUE | SETTING VALUE TO BE USED (EA BIAS VOLTAGE) |
|---|---|---|
| T1 | V1 | |
| T2 | V2 | V2 |
| T3 | V3 | |
| ⋮ | ⋮ | |
| Tn | Vn | |

TEMPORARILY STORED TABLE INFORMATION
AND SETTING VALUE TO BE USED

OPTICAL TRANSMISSION DEVICE, OPTICAL TRANSMISSION/RECEPTION DEVICE, CONTROL METHOD, AND CONTROL PROGRAM HAVING HEATING AND COOLING CONTROL FUNCTIONS OF A TEMPERATURE CONTROL ELEMENT

CROSS-REFERENCE TO RELATED APPLICATION

This application is based upon and claims the benefit of priority from Japanese patent application No. 2011-030229, filed on Feb. 15, 2011, the disclosure of which is incorporated herein in its entirety by reference.

BACKGROUND OF THE INVENTION

1. Field of the Invention

The present invention relates to an optical transmission device, an optical transmission/reception device, a control method, and a control program. More specifically, the present invention relates to an optical transmission device which outputs transmission data by converting it into optical signals, an optical transmission/reception device, a control method, and a control program.

2. Description of the Related Art

Recently, there has been a wide spread of an optical transmission/reception device which is connected to an optical communication net that transmits a vast amount of information at a high speed for having optical communications mutually with other communication apparatuses connected to the optical communication net. The optical transmission/reception device is provided with a transmission-side circuit which converts main signal data outputted from a host-side device into optical signals and transmits the optical signals to the communication apparatuses on the optical communication net side via an optical fiber.

The transmission-side circuit includes a laser diode, for example, as a light source for generating laser beams, and an electric absorption (EA) optical modulator which modulates the generated laser beams. It is desired to integrate those modules, to reduce the power consumption, etc.

Under such circumstance, an optical transmission device including a wavelength variable light source, and an EA (electric absorption) modulator, and a thermoelectric cooler is proposed in Japanese Unexamined Patent Publication 2009-81512 (Patent Document 1), for example. The optical transmission device is structured to input an EA bias to the EA modulator from a control unit, and to modulate light outputted from the wavelength variable light source according to the modulation characteristic in accordance with the EA bias. Further, the control unit controls the temperature of the thermoelectric cooler so that the EA temperature information showing the temperature of the EA modulator becomes the target temperature.

Further, Japanese Unexamined Patent Publication 2004-296988 (Patent Document 2) discloses a laser diode having an electric absorption modulator which detects the temperature of the laser diode by a thermistor, and increases the amount of heat generated by a heater so as to have an optimum temperature when the outside temperature is low while decreasing the amount of heat when the temperature is optimum. The laser diode having the electric absorption modulator controls the temperature of the laser diode without using an electric cooler element.

Further, Japanese Unexamined Patent Publication Hei 11-126939 (Patent Document 3) discloses a temperature control device of a semiconductor laser module (LD module) including a TEC (thermoelectric cooler), PD (photodiode), a temperature detection element (thermistor), an LD chip, and the like housed inside a package. The temperature control device is structured not to control the temperature of the LD chip when the outside temperature Ta is within a guaranteed temperature range of the semiconductor laser and not to apply a Peltier current to the TEC.

Further, it is depicted in NTT Photonics Laboratories, Wataru Kobayashi, et al., "Low Power Consumption 1.55 μm EADFB Laser", NTT Technical Review, November 2010 (Vol. 22 No. 11), pp. 69-73 (Non-Patent Document 1) that the property of a wide temperature range is improved even in an uncooled action (uncontrolled temperature) by using indium-gallium-aluminum arsenic based semiconductor material (Al based material) as a material for fabricating an EA modulator integrated DFB (distributed feedback) laser (EA-DFB laser).

However, the optical transmission device depicted in Patent Document 1 determines a threshold value (value of the EA temperature) based on the number of FIT (failure in time), the power consumption, and the EA temperature, and controls the temperature control current by having the temperature and the wavelength of the EA modulator as input information. The optical transmission device is structured to control the temperature control current within a range of TA<Tn<Tb (upper limit temperature Ta, target temperature Tn, lower limit temperature Tb), so that the power is consumed.

Further, while Patent Document 2 discloses a technique which loads a heat generator so as to control the temperature of the laser diode to be within a defined temperature range set in advance, it is designed to control the amount of heat generated by the heat generator.

Furthermore, while Patent Document 3 mentioned above discloses a technique which includes a thermistor whose resistance value changes according to the temperature of the semiconductor laser module (LD chip), and controls the temperature of the LD chip according to the temperature of the LD chip so that the temperature of the LD chip falls within a specific range (guaranteed range), the output property of the LD chip is changed with a change in the temperature of the guaranteed range.

It is therefore an exemplary object of the present invention to provide an optical transmission device, an optical transmission/reception device, a control method, and a control program, which can acquire a fine light output property of the optical signals to be outputted.

SUMMARY OF THE INVENTION

In order to achieve the foregoing object, the optical transmission device according to an exemplary aspect of the invention is characterized to include: an optical transmission unit which includes a light source that emits a laser beam, a modulator that modulates the laser beam, a modulator temperature detection element that detects a modulator temperature of the modulator, and a temperature control element that has functions of heating and cooling the modulator to execute a temperature control; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, wherein the main control unit includes: a function which functions when the casing temperature is within a range of a low-temperature side reference temperature and a high-temperature side reference temperature set in advance so as to stop each control action regarding heating and cooling of the temperature control element for the modulator; a function which functions when the casing temperature is equal to or lower than the low-temperature side reference temperature so as to execute a heating control of the temperature control element and to set the bias voltage corresponding to the low-temperature side reference temperature to the modulator based on the table information; and a function which functions when the casing temperature is equal to or higher than the high-temperature side reference temperature so as to execute a cooling control of the temperature control element and to set the bias voltage corresponding to the high-temperature side reference temperature to the modulator based on the table information.

Further, in order to achieve the foregoing object, the optical transmission device action control method according to another exemplary aspect of the invention is a method used for an optical transmission device including an optical transmission unit which includes a light source that emits a laser beam, a modulator that modulates the laser beam, a modulator temperature detection element that detects a modulator temperature of the modulator, a temperature control element that has functions of heating and cooling the modulator to control the temperature, a main control unit that controls actions of each section of the optical transmission unit, a memory unit that records table information generated in advance for setting a bias voltage for the modulator, a casing that houses the optical transmission unit, the main control unit, and the memory unit, and a casing temperature detection element that detects a casing temperature of the casing, and the method is characterized to include: when the casing temperature detected by the casing temperature detection element is within a range of a low-temperature side reference temperature and a high-temperature side reference temperature set in advance (a temperature judging step), stopping each control action regarding heating and cooling of the temperature control element for the modulator (a heating/cooling stopping step); when the casing temperature is equal to or lower than the low-temperature side reference temperature (an equal-to-or-lower-than low-temperature side reference temperature judging step), executing a heating control of the temperature control element so that the modulator temperature becomes the low-temperature side reference temperature (a heating control step) and setting the bias voltage corresponding to the low-temperature side reference temperature to the modulator based on the table information (a low-temperature side bias setting step); and when the casing temperature is equal to or higher than the high-temperature side reference temperature (an equal-to-or-higher-than high-temperature side reference temperature judging step), executing a cooling control of the temperature control element so that the modulator temperature becomes the high-temperature side reference temperature (a cooling control step) and setting the bias voltage corresponding to the high-temperature side reference temperature to the modulator based on the table information (a high-temperature side bias setting step), wherein each of setting control actions is executed by the control unit in order.

Furthermore, in order to achieve the foregoing object, the recording medium nontemporarily recording an optical transmission device action control program according to still another exemplary aspect of the invention is characterized to causes a computer, which is provided to a main control unit of an optical transmission device including an optical transmission unit that includes a light source that emits a laser beam, a modulator that modulates the laser beam, a modulator temperature detection element that detects a modulator temperature of the modulator, a temperature control element that has functions of heating and cooling the modulator to control the temperature, a main control unit that controls actions of each section of the optical transmission unit, a memory unit that records table information generated in advance for setting a bias voltage for the modulator, a casing that houses the optical transmission unit, the main control unit, and the memory unit, and a casing temperature detection element that detects a casing temperature of the casing, to execute: an in-temperature-range judging function which judges that the casing temperature detected by the casing temperature detection element is within a temperature range of a low-temperature side reference temperature and a high-temperature side reference temperature set in advance; a heating/cooling stop control function which functions when the casing temperature is within the temperature range so as to stop each control action regarding heating and cooling of the temperature control element for the modulator; an equal-to-or-lower-than low-temperature side reference temperature judging function which judges that the casing temperature is equal to or lower than the low-temperature side reference temperature; an equal-to-or-lower-than low-temperature side reference temperature heating function which functions when the casing temperature is equal to or lower than the low-temperature side reference temperature so as to execute a heating control of the temperature control element; a low-temperature side bias setting function which functions when the casing temperature is equal to or lower than the low-temperature side reference temperature so as to set the bias voltage corresponding to the low-temperature side reference temperature to the modulator based on the table information; an equal-to-or-higher-than high-temperature side reference temperature judging function which judges that the casing temperature is equal to or higher than the high-temperature side reference temperature; an equal-to-or-higher-than high-temperature side reference temperature cooling function which functions when the casing temperature is equal to or higher than the high-temperature side reference temperature so as to execute a cooling control of the temperature control element; and a high-temperature side bias setting function which functions when the casing temperature is equal to or higher than the high-temperature side reference temperature so as to set the bias voltage corresponding to the high-temperature side reference temperature to the modulator based on the table information.

BRIEF DESCRIPTION OF THE DRAWINGS

FIG. 7 is a table showing the table information stored temporarily in the control circuit shown in FIG. 1 and setting values (bias voltages) to be used;

DETAILED DESCRIPTION OF THE PREFERRED EMBODIMENTS

Hereinafter, an exemplary embodiment of an optical transmission/reception device including an optical transmission device according to the present invention will be described by referring to FIG. 1 to FIG. 7.

(Structure of Optical Transmission/Reception Device)

Figure 1:
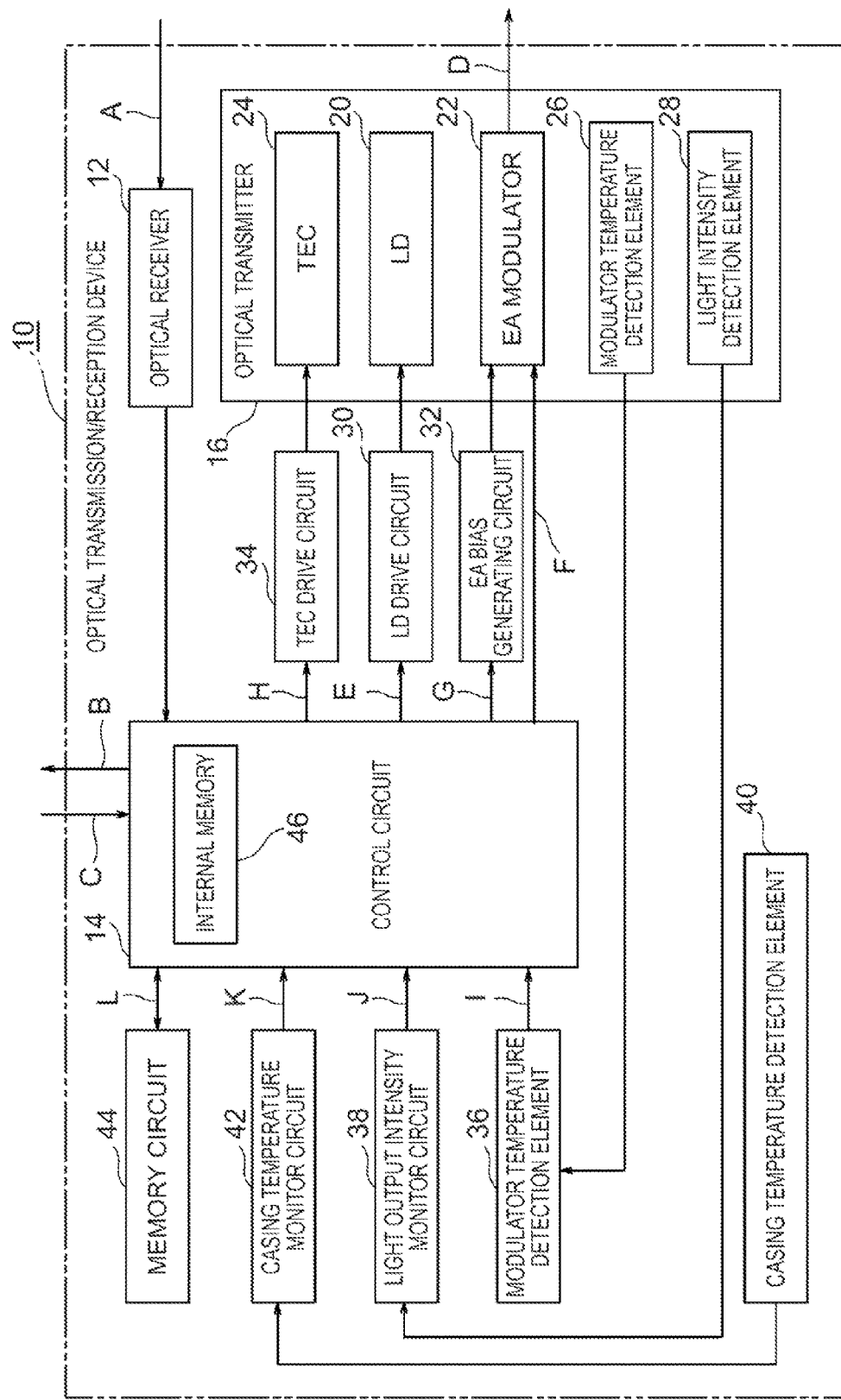
FIG. 1 is a block diagram showing an example of the structure of a transmission/reception device according to an exemplary embodiment to which the present invention is employed.

Referring to FIG. 1, the optical transmission/reception device 10 is an optical transceiver having a transmission/reception function which receives optical signals transmitted from another optical communication device by an optical receiver (optical reception device) 12 via an optical fiber A, converts the optical signals into electric signals, outputs the converted reception signal data from an output B of a control circuit 14, converts input data C supplied to the control circuit 14 from another connected apparatus into optical signals by an optical transmitter (optical transmission device) 16, and sends out the optical signals to an optical fiber D from the optical transmitter 16. The optical transmitter 16 according to the exemplary embodiment is structured to be operable with a fine output property particularly by a temperature control and an output control done by the control circuit 14.

More specifically, the optical transmitter 16 optically modulates a laser beam generated by a laser diode (LD) 20 through an EA (Electro Absorption) modulator 22, and sends it out to the optical fiber D. Further, the optical transmitter 16 is provided with: a thermoelectric cooler (TEC) 24 provided in the vicinity of the EA modulator 22 for adjusting the temperature of the EA modulator 22; a modulator temperature detection element 26 provided in the vicinity of the EA modulator 22 for detecting the temperature thereof; and a light intensity detection element 28 which receives the laser beam of the laser diode 20, and detects the light intensity thereof.

The laser diode (LD) 20 is a light source which generates a laser beam in accordance with a drive current of a forward direction supplied from an LD drive circuit 30. The LD drive circuit 30 is connected to the control circuit 14 via a connecting line E, and generates a drive current according to a control of the control circuit 14.

The operation point of the EA modulator 22 is set in accordance with the EA bias voltage applied from an EA bias generating circuit 32 with a reverse bias, and the EA modulator 22 modulates the intensity of the laser beam by changing the absorption rate of the laser beam generated from the laser diode 20 based on main signal data. The main signal data outputted from the control circuit 14 is inputted to the EA modulator 22 via a connecting line F, and the EA modulator 22 outputs modulated light of an extinction ratio that corresponds to the EA bias voltage and the temperature of the EA modulator 22 (EA modulator temperature). Further, the EA bias generating circuit 32 is connected to the control circuit 14 via a connecting line G, and applies the EA bias voltage to the EA modulator 22 based on the control of the control circuit 14.

The thermoelectric cooler (TEC) 24 is a temperature control element which heats and cools the EA modulator 22 by radiating and absorbing heat in accordance with the polarity of the drive current supplied from the TEC drive circuit 34. For example, a Peltier element capable of switching radiation of heat and absorption of heat is employed as the thermoelectric cooler 24. The thermoelectric cooler 24 is provided in the vicinity of the EA modulator 22 to be capable of transmitting the temperature, and it is structured to adjust the EA modulator temperature (TEA) of the EA modulator 22. The TEC drive circuit 34 is connected to the control circuit 14 via a connecting line H, and generates the drive current based on the control of the control circuit 14.

The modulator temperature detection element 26 is provided in the vicinity of the EA modulator 22 to be capable of detecting the temperature so as to detect the EA modulator temperature (TEA). For example, a thermistor element exhibiting changes in the resistance value depending on the temperatures is employed for the modulator temperature detection element 26. The modulator temperature detection element 26 is connected to a modulator temperature monitor circuit 36. The modulator temperature monitor circuit 36 monitors the EA modulator temperature based on the change in the resistance of the modulator temperature detection element 26, and outputs data showing the monitored result to the control circuit 14 via a connecting line I.

The light intensity detection element 28 is a detection element which receives a part of a laser beam generated from the laser diode 20 via the EA modulator 22, and generates a signal of a level that corresponds to the light reception amount. For example, a photodiode is employed for the light intensity detection element 28. The output of the light intensity detection element 28 is connected to a light output intensity monitor circuit 38, and the light output intensity monitor circuit 38 monitors the light intensity of the laser beam from the output of the light intensity detection element 28. The light output intensity monitor circuit 38 outputs light intensity data acquired as a result of the monitoring to the control circuit 14 via a connecting line J.

A casing temperature detection element 40 for detecting the temperature inside a casing of the device, i.e., the casing temperature (TC), is provided to the optical transmission/reception device 10. As the casing temperature detection element 40, a thermistor element exhibiting changes in the resistance value depending on the temperature is employed, for example. The casing temperature detection element 40 is connected to a casing temperature monitor circuit 42 via a connecting line, and the casing temperature monitor circuit 42 monitors the casing temperature and outputs data showing the monitored result to the control circuit 14 via a connecting line K.

The control circuit 14 is a main control unit for controlling the entire actions of the transmission/reception device 10, and the control circuit 14 includes: a transmission/reception control function which controls transmission/reception of optical signals in the optical transmitter 16 and the optical receiver 12, respectively; a temperature control function which controls the temperature within the optical transmitter 16 to be within a range set in advance; and an output control function which stabilizes the optical signals outputted from the optical transmitter 16. The control circuit 14 executes the temperature control and the output control based on the table information recorded on a memory circuit 44 connected via a connecting line L. The control circuit 14 is provided with a central processing processor for executing the control processing, and a storage circuit such as a ROM and a RAM for storing a control program and data.

The control circuit 14 includes an internal memory 46 which reads out the table information required for the temperature control and the output control from the memory circuit 44 in advance and temporarily stores it for reading and writing the table information at a high speed. Further, the control circuit 14 includes a table information generating processing function which generates the table information that is recorded on the memory circuit 44. As the memory circuit 44, a storage circuit such as EEPROM or a flash memory capable of performing electrical rewriting can be employed favorably, for example.

Now, the functional structure of the control circuit 14 will be described in details by referring to the functional block diagram shown in FIG. 2. As shown in the drawing, as the structure associated mainly with the temperature control, the control circuit 14 includes: a casing temperature measurement processing unit 50 connected to the casing temperature monitor circuit 42 via the connecting line K; and a modulator temperature measurement processing unit 52 connected to the modulator temperature monitor circuit 36 via the connecting line I.

Further, as the structure associated with the temperature control, the control circuit 14 includes: a casing temperature comparison processing unit 58 connected to each of a high temperature reference setting processing unit 54 for setting a high-temperature side reference temperature and a low temperature reference setting processing unit 56 for setting a low-temperature side reference temperature to compare the casing temperature with each of the high-temperature side reference temperature and the low-temperature side reference temperature; and a temperature judgment processing unit 60 connected to the casing temperature comparison processing unit 58 to judge the relation regarding the values of the high-temperature side reference temperature, the low-temperature side reference temperature, and the casing temperature based on the comparison result of the casing temperature.

Further, as the structure associated with the temperature control, the control circuit 14 includes: a temperature control judgment processing unit 62 connected to the temperature judging processing unit 60; a TEC drive control unit 64 connected to the temperature control judgment processing unit 62; and a stop judgment processing unit 66 connected to each of the high-temperature side reference temperature setting processing unit 54, the low-temperature side reference temperature setting processing unit 56, and the modulator temperature measurement processing unit 52.

More specifically, the casing temperature measurement processing unit 50 is a processing unit which measures the casing temperature (TC) by inputting the data acquired by the monitoring done by the casing temperature monitor circuit 42, and holds the casing temperature (TC). The measurement of the casing temperature done by the casing temperature measurement processing unit 50 is repeated continuously at timings set in advance. When the monitored result of the casing temperature monitor circuit 42 is changed, the held value is updated to the changed value. The modulator temperature measurement processing unit 52 is a processing unit which measures the EA modulator temperature (TEA) by inputting the data showing the monitored result of the modulator temperature monitor circuit 36, and holds the EA modulator temperature (TEA). The measurement of the EA modulator temperature done by the modulator temperature measurement processing unit 52 is repeated continuously at timings set in advance. When the monitored result of the modulator temperature monitor circuit 36 is changed, the held value is updated to the changed value.

The high-temperature reference temperature setting processing unit 54 is a processing unit which holds the value showing the high-temperature side reference temperature (T_heat) of the casing temperature (TC), and sets it to each functional unit as necessary. Further, the low-temperature reference temperature setting processing unit 56 is a processing unit which holds the value showing the low-temperature side reference temperature (T_cool) of the casing temperature (TC), and sets it to each functional unit as necessary. The high-temperature side reference temperature (T_heat) and the low-temperature side reference temperature (T_cool) may be saved in the memory circuit 44 (FIG. 1). In that case, each of the high-temperature reference temperature setting processing unit 54 and the low-temperature reference temperature setting processing unit 56 may be structured to read out the values of each reference temperature from the memory circuit 44, and to hold the values.

The casing temperature comparison processing unit 58 is a processing unit which compares the casing temperature (TC) with each of the high-temperature side reference temperature (T_heat) and the low-temperature side reference temperature (T_cool), and sends the result of the comparison to the temperature judgment processing unit 60.

The temperature judgment processing unit 60 judges whether or not the casing temperature is equal to or higher than the high-temperature side reference temperature (TC≥T_heat), whether or not the casing temperature is equal to or lower than the low-temperature side reference temperature (TC≤T_cool), and whether or not the casing temperature is lower than the high-temperature side reference temperature (TC<T_heat) and higher than the low-temperature side reference temperature (TC>T_cool). The temperature judgment processing unit 60 sends the result of the judgment to the temperature control judgment processing unit 62.

The temperature control judgment processing unit 62 is a processing unit which determines to execute a control whether to cool, heat, or neither to :Cool nor to heat the thermoelectric cooler 24 (FIG. 1) based on the result of the judgment done by the temperature judgment processing unit 60.

Specifically, the temperature control judgment processing unit 62 determines to execute a control for cooling the thermoelectric cooler 24, when the temperature judgment processing unit 60 shows the judgment result indicating that the casing temperature is equal to or higher than the high-temperature side reference temperature (TC≥T_heat). Further, the temperature control judgment processing unit 62 determines to execute a control for heating the thermoelectric cooler (TEC) 24 (FIG. 1), when the temperature judgment processing unit 60 shows the judgment result indicating that the casing temperature is equal to or lower than the low-temperature side reference temperature (T≤T_cool). Furthermore, the temperature control judgment processing unit 62 determines neither to cool nor to heat the thermoelectric cooler (TEC) 24 (FIG. 1), when the temperature judgment processing unit 60 shows the judgment result indicating that the casing temperature is lower than the high-temperature side reference temperature (TC<T_heat) and higher than the low-temperature side reference temperature (TC>T_cool).

Such determination information of the temperature control judgment processing unit 62 is transmitted to the TEC drive control unit 64, and the TEC drive control unit 64 outputs a control signal according to the determination of the temperature control judgment processing unit 62. The output of the TEC drive control unit 64 forms the output of the control circuit 14, and it is connected to the TEC drive circuit 34 shown in FIG. 1 via the connecting line H. The TEC drive circuit 34 switches cooling (absorption of heat) and heating (radiation of heat) of the thermoelectric cooler 24 by supplying drive currents of inverted polarities to the thermoelectric cooler 24 for the case of cooling and the case of heating. The TEC drive circuit 34 stops supply of current, when neither cooling nor heating is executed.

Figure 3:
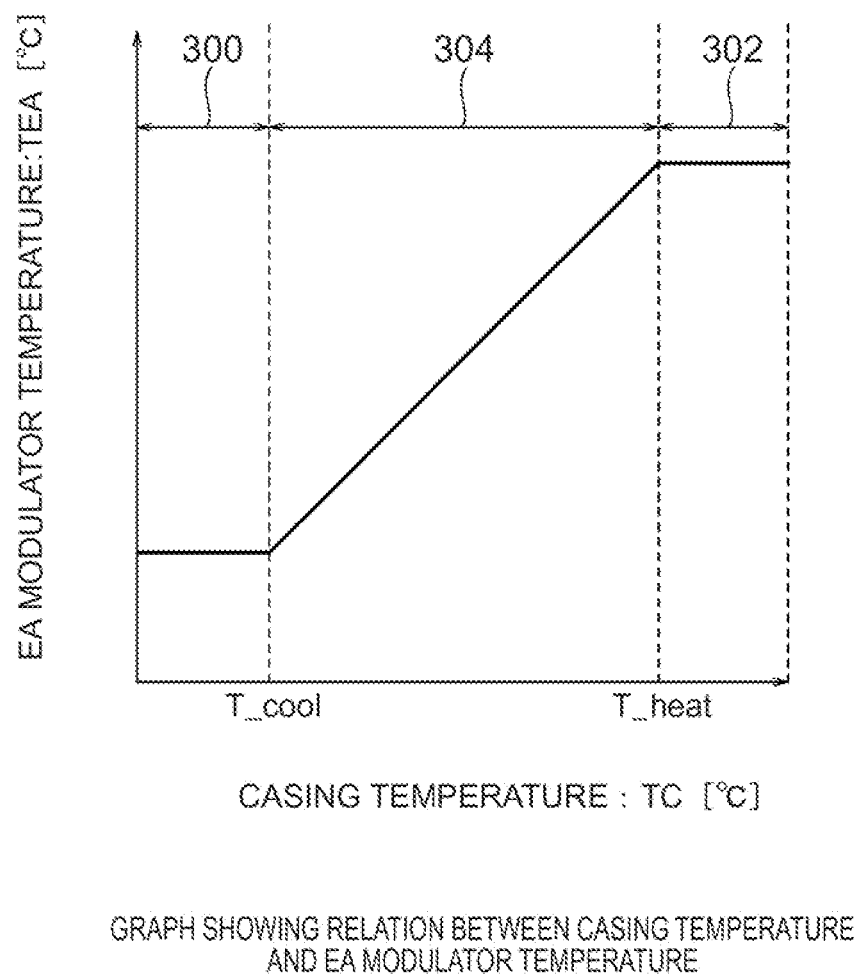
FIG. 3 is a characteristic chart showing the relation between the temperatures of a casing (TC) and the temperatures of an EA modulator (TEA) according to the exemplary embodiment.

Referring to FIG. 3, shown therein is a relation between the casing temperature (TC) of the optical transmitter 16 under the control of the control circuit 14 and the EA modulator temperature. In the chart, the lateral axis is the casing temperature (TC), and the longitudinal axis is the EA modulator temperature (TEA). As shown in the chart, when the casing temperature is in a range 300 that is equal to or lower than the low-temperature side reference temperature (TC≤T_cool), the TEC drive circuit 34 drives the thermoelectric cooler 24 to radiate the heat to prevent decrease of the EA modulator temperature (TEA) by being controlled according to the determination of the temperature control judgment processing unit 62. Thus, the temperature thereof can be maintained.

Further, when the casing temperature is in a range 302 that is equal to or higher than the high-temperature side reference temperature (TC≥T_heat), the TEC drive circuit 34 drives the thermoelectric cooler 24 to absorb the heat to prevent increase of the EA modulator temperature (TEA) by being controlled according to the determination of the temperature control judgment processing unit 62. Thus, the temperature thereof can be maintained. Through executing such temperature control, it becomes possible to keep the EA modulator temperature (TEA) within the operating range of the EA modulator 22 (FIG. 1) and to use it under an environment of a still wider range of the casing temperature.

Furthermore, when the casing temperature is in a range 304 that is lower than the high-temperature side reference temperature (TC<T_heat) and higher than the low-temperature side reference temperature (TC>T_cool), the temperature control judgment processing unit 62 determines not to perform cooling and heating on the thermoelectric cooler 24 (FIG. 1). Thus, when radiation of heat or absorption of heat is being executed, such action is stopped. Thus, in this range 304, the power consumed for driving the thermoelectric cooler 24 can be saved. In this case, the EA modulator temperature (TEA) changes in accordance with the change in the casing temperature. A fine output property of the EA modulator 22 can be acquired through properly executing the output control at that time by an EA bias voltage setting processing function to be described later.

Figure 2:
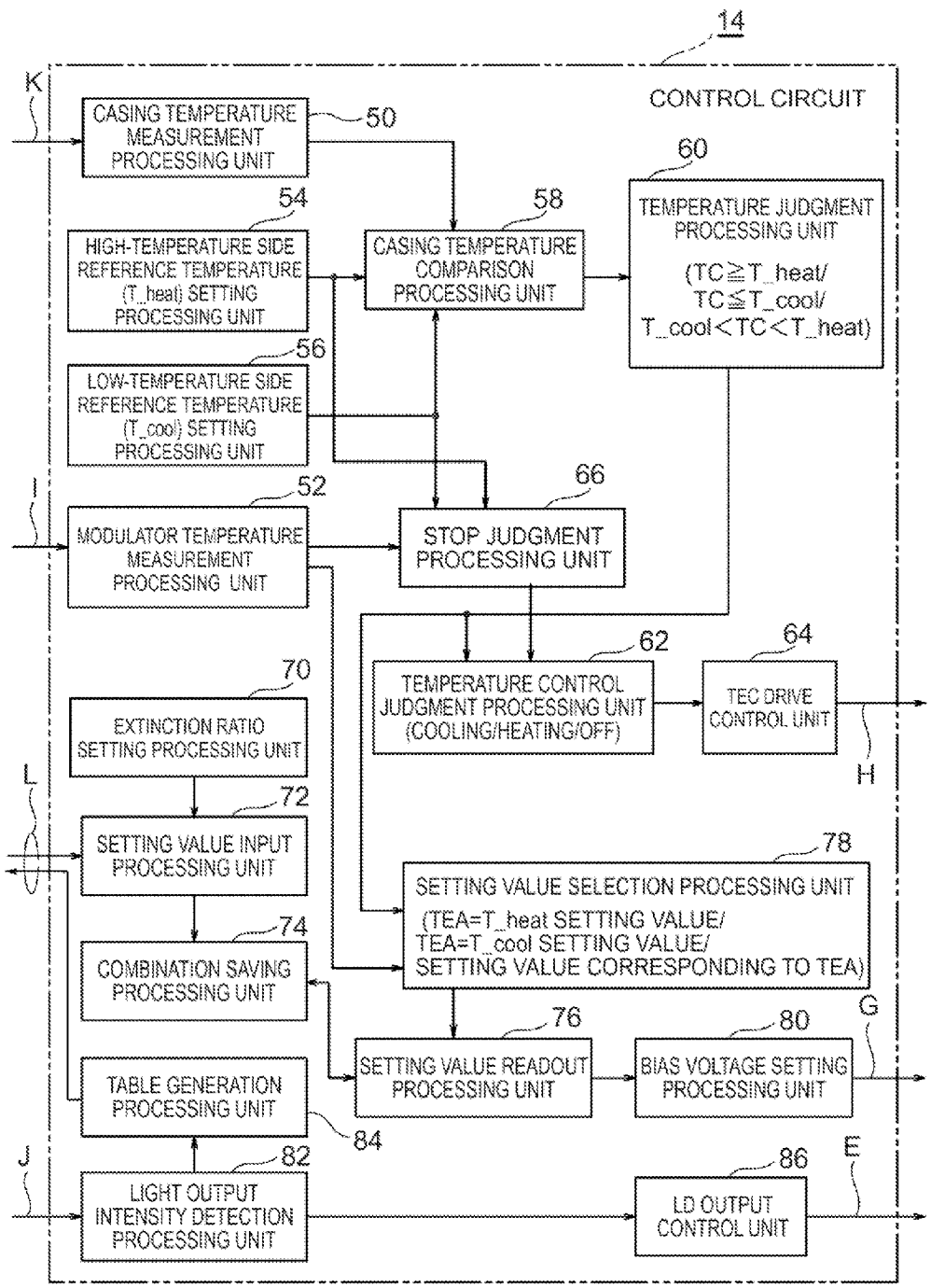
FIG. 2 is a functional block diagram showing an example of the structure of a control circuit according to the exemplary embodiment of the present invention.

In FIG. 2, the stop judgment processing unit 66 is a processing unit which stops (sets off) the cooling control and the heating control according to the EA modulator temperature acquired by the modulator temperature measurement processing unit 52, when such control is executed on the thermoelectric cooler 24. The modulator temperature measurement processing unit 52 is a processing unit to which the output of the modulator temperature monitor circuit 36 is connected via the connecting line I, which measures the EA modulator temperature (TEA) by receiving the input of data showing the result of monitoring the temperature of the modulator temperature detection element 26 (FIG. 1), and holds the EA modulator temperature (TEA). The measurement of the EA modulator temperature done by the modulator temperature measurement processing unit 52 is repeated continuously at timings set in advance. When the monitored result of the modulator temperature monitor circuit 36 is changed, the held value is updated to the changed value. The stop judgment processing unit 66 judges whether or not to stop the cooling control and the heating control for the thermoelectric cooler 24 based on the EA modulator temperature measured by the modulator temperature measurement processing unit 52. The output of the stop judgment processing unit 66 is connected to the temperature control judgment processing unit 62 described above.

Further, as the structure associated mainly with the bias control for the EA modulator 22, the control circuit 14 includes: an extinction ratio setting processing unit 70; a setting value input processing unit 72 connected to the extinction ratio setting processing unit 70; a combination saving processing unit 74 connected to the setting value input processing unit 72; a setting value readout processing unit 76 connected to the combination saving processing unit 74; a setting value selection processing unit 78 connected to the setting value readout processing unit 76; and a bias voltage setting processing unit 80 connected to the setting value selection processing unit 78.

More specifically, the extinction ratio setting processing unit 70 is a processing unit which sets the extinction ratio of the laser beam outputted from the optical transmitter 16 in advance. The extinction ratio is a ratio of the light output intensity corresponding to a binary signal. In the table information in the memory circuit 44 to be described later, table information corresponding to the set extinction ratio is recorded. There maybe one kind or a plurality of kinds set as the extinction ratio. In a case where a plurality of kinds of extinction ratios are to be set, table information corresponding to each of the set extinction ratios is recorded to the memory circuit 44.

The setting value input processing unit 72 is a processing unit which reads out the table information corresponding to the extinction ratio set by the extinction ratio setting processing unit 70 from the memory circuit 44, and inputs it.

The combination saving processing unit 74 is a processing unit which saves the table information read out by the setting value readout processing unit 72 to a storage region set in advance. Tn the structural example of FIG. 1, the storage region is expressed as the internal memory 46 within the control circuit 14. As shown in FIG. 7, the combination saving processing unit 74 temporarily stores the combinations of the EA modulator temperatures (TEA) and the EA bias voltages to the internal memory 46.

In FIG. 2, the setting value readout processing unit 76 is a processing unit which reads out, from the storage region, a combination corresponding to a condition selected by the setting value selection processing unit 78 out of the EA modulator temperatures and the EA bias voltages saved in the internal memory 46 by the combination saving processing unit 74.

Specifically, first, when the temperature judgment processing unit 60 judges that the casing temperature is equal to or higher than the high-temperature side reference temperature (TC≥T_heat), the setting value selection processing unit 78 does not select the EA bias voltage setting value corresponding to the current EA modulator temperature (TEA) but selects the EA bias voltage setting value corresponding to the value of the high-temperature side reference temperature (T_heat). Further, when the temperature judgment processing unit 60 judges that the casing temperature is equal to or lower than the low-temperature side reference temperature (TC≤T_cool), the setting value selection processing unit 78 does not select the EA bias voltage setting value corresponding to the current EA modulator temperature (TEA) but selects the EA bias voltage setting value corresponding to the value of the low-temperature side reference temperature (T_cool). Furthermore, when the temperature judgment processing unit 60 judges that the casing temperature is higher than the low-temperature side reference temperature and lower than the higher-side reference temperature (T_cool<TC<T_heat), the setting value selection processing unit 78 selects the EA bias voltage setting value corresponding to the value of the current EA modulator temperature (TEA).

The setting value readout processing unit 76 is a processing unit which reads out the EA bias voltage setting value selected by the setting value selection processing unit 78 from the internal memory 46, and indicates the read out value to the bias voltage setting processing unit 80. Further, as shown in FIG. 7, the setting value readout processing unit 76 sends the read out value to the combination saving processing unit 74 as the EA bias voltage to be used currently, and the combination saving processing unit 74 saves and updates the EA bias voltage value to be used currently in the internal memory 46.

The bias voltage setting processing unit 80 outputs the EA bias voltage setting value read out by the setting value readout processing unit 76 to the EA bias generating circuit 32 (FIG. 1) connected via the connecting line G. The EA bias generating circuit 32 shown in FIG. 1 is a circuit which generates the EA bias voltage according to the EA bias voltage setting value, and supplies the generated EA bias voltage to the EA modulator 22 inside the optical transmitter 16.

In FIG. 2, as the structure associated with generation of the table information, the control circuit 14 includes: a light intensity detection processing unit 82 which is connected to the light output monitor 38 (FIG. 1) via the connecting line J; and a table generation processing unit 84 which is connected to the light intensity detection processing unit 82.

The light intensity detection processing unit 82 is a processing unit which detects the light intensity monitored by the light output monitor circuit 38 (FIG. 1), and outputs the detected light intensity to the table generation processing unit 84 and an LD output control unit 86, respectively.

The table generation processing unit 84 is a processing unit which generates the table information for executing the temperature control and the output control of the optical transmitter 16.

Figure 4:
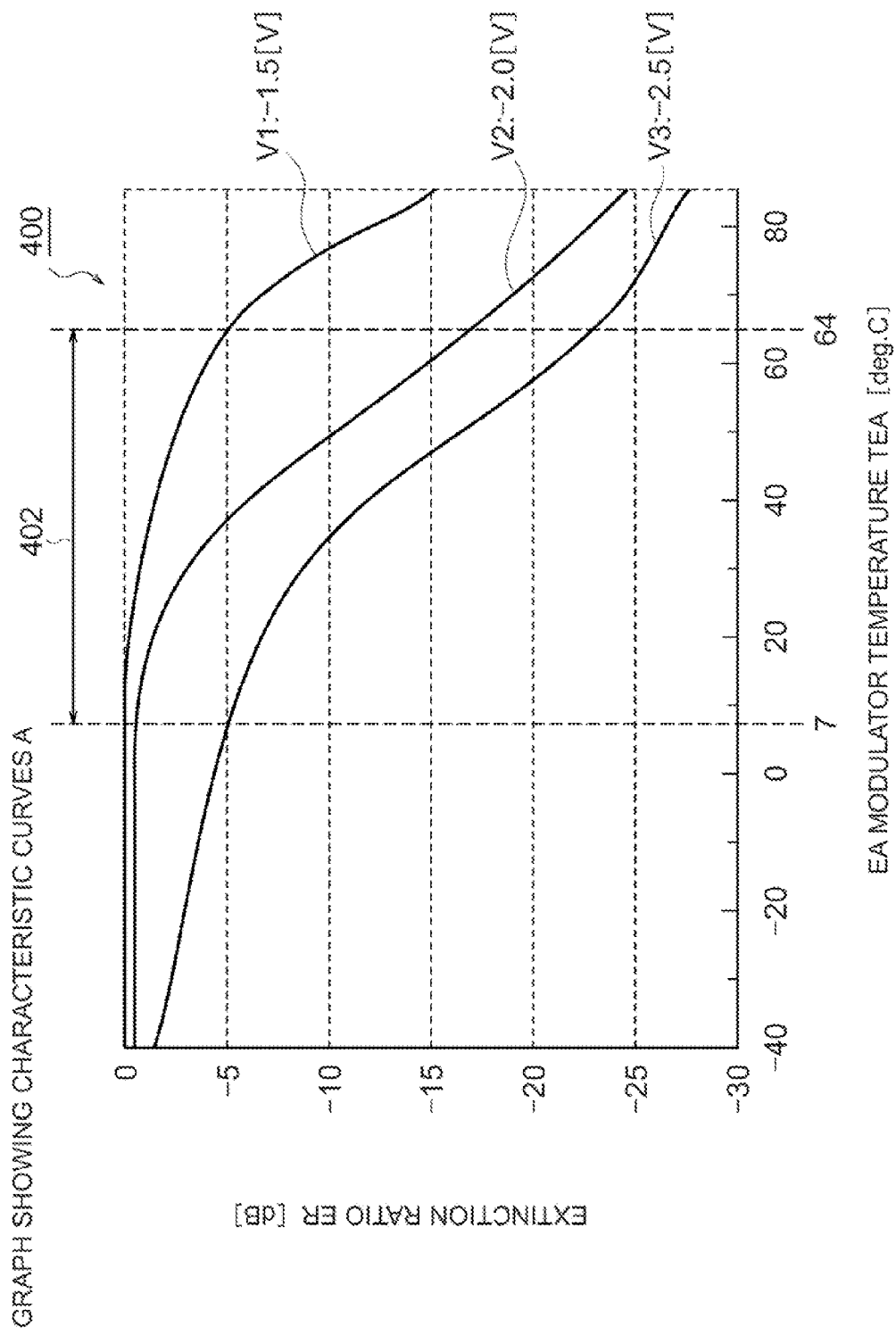
FIG. 4 is a characteristic chart showing the relation between the temperatures of the EA modulator (TEA) and extinction ratios (ER) according to the exemplary embodiment.
Figure 5:
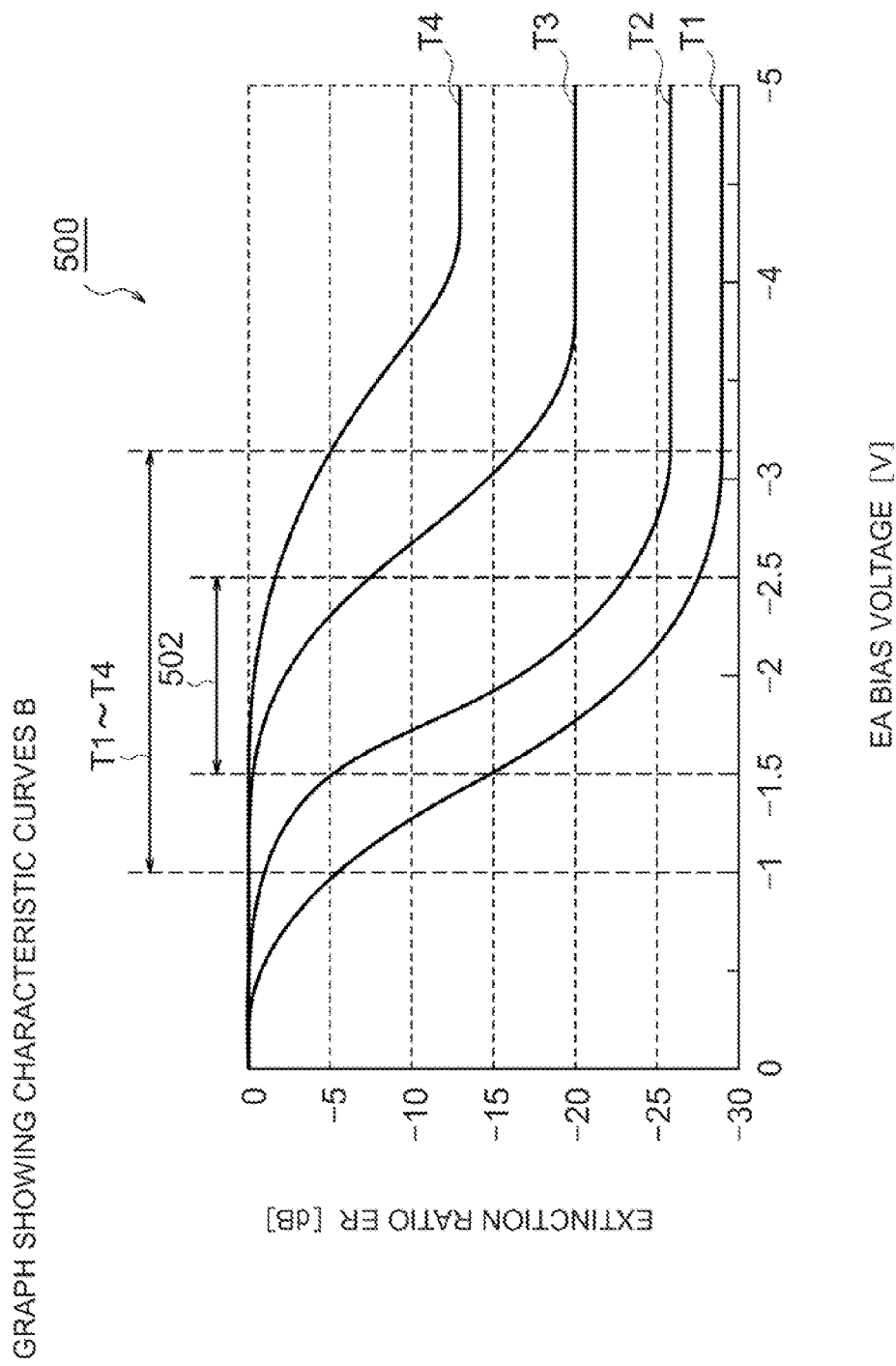
FIG. 5 is a characteristic chart showing the relation between EA bias voltages of the EA modulator and extinction ratios (ER) according to the exemplary embodiment.

More specifically, the table generation processing unit 84 has a characteristic extraction processing function which acquires a numerical value data group showing a characteristic curve A of the EA modulator temperature (TEA) with respect to the extinction ratio (ER), and generates a characteristic curve B of the EA bias voltage with respect to the extinction ratio (ER) based on the acquired numerical value data group. FIG. 4 and FIG. 5 show graphs generated by the function of the characteristic extraction processing, respectively.

FIG. 4 shows a characteristic chart 400 in which the characteristic curves A showing the relation of the EA modulator temperature (TEA) with respect to the extinction ratio (ER) are plotted. In this characteristic chart 400, the lateral axis shows the EA modulator temperature (TEA), and the longitudinal axis shows the extinction ratio (ER).

Note here that a curve V1 is a characteristic when the EA bias voltage is set to −1.5 V, a curve V2 is a characteristic when the EA bias voltage is set to −2.0 V, and a curve V3 is a characteristic when the EA bias voltage is set to −2.5 V. Further, a range 402 in the chart shows that the EA modulator temperature (TEA) when the extinction ratio ER is −5 dB is in a range of 7 degrees centigrade to 64 degrees centigrade as a way of example. In the characteristic chart 400, only a part of the characteristic curves A (V1 to V3) of the EA bias voltages V1 to V3 is shown for avoiding the complication of the chart. However, actually, other characteristic curves acquired by setting other EA bias voltages are acquired in details. Further, through executing approximate interpolation, a characteristic curve corresponding to still another EA bias voltage can be acquired in details.

Further, FIG. 5 shows a characteristic chart 500 showing the relation of the EA bias voltage with respect to the extinction ratio (ER). In this characteristic chart 500, the lateral axis shows the EA bias voltage, and the longitudinal axis shows the extinction ratio (ER). In the characteristic chart 500, only a part of the characteristic curves B (T1 to T4) of the EA modulator temperatures T1 to T4 is shown for avoiding the complication of the chart. However, as in the above, other characteristic curves acquired with other EA modulator temperatures are acquired in details. Further, through executing approximate interpolation, a characteristic curve corresponding to still another EA modulator temperature can be acquired in details. The EA modulator temperatures T1 to T4 are in the relation of T1>T2>T3>T4 in order from the higher value to the lower value. Further, those are the characteristics when the drive current for driving the laser diode (LD) 20 (FIG. 1) is constant. Furthermore, it is shown as a way of example here that a range 502 is included in a range of the EA modulator temperatures T1 to T4 of the characteristic curves crossing with each other when the extinction ratio (ER) is −5 dB. In this case, it can be found that the EA bias voltages corresponding to the range 502 are −1.5 V to −2.5 V.

Figure 6:
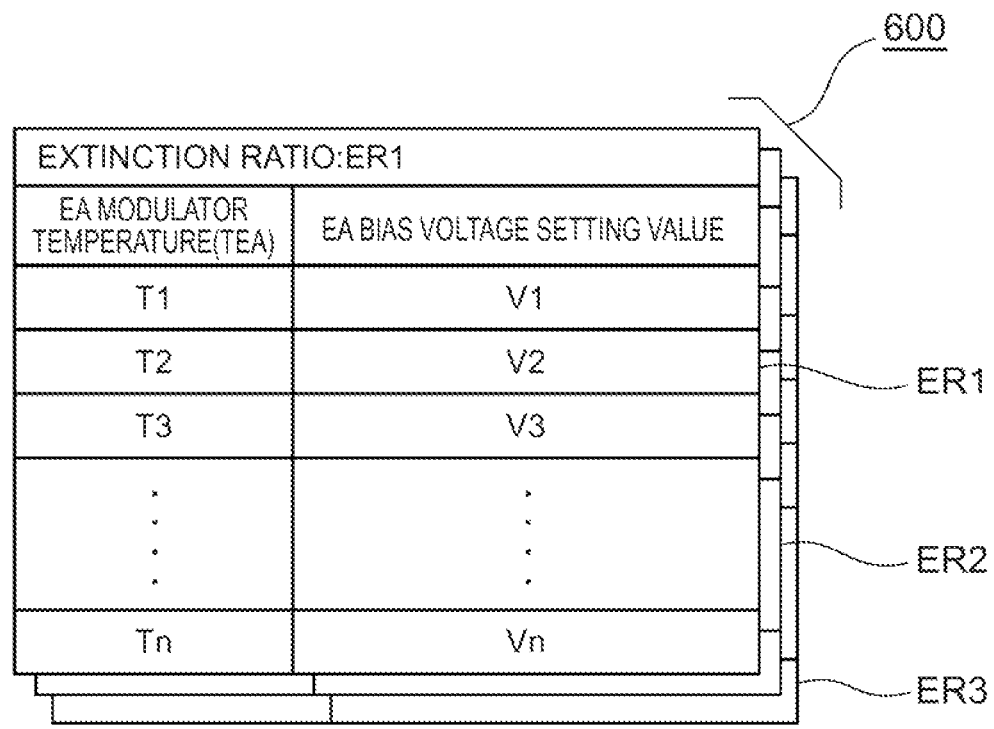
FIG. 6 is an illustration showing table information recorded on the memory circuit shown in FIG. 1.

The table generation processing unit 84 has a processing function which generates table information 600 as in FIG. 6 for each of a plurality of extinction ratios by using each numerical value data of the characteristic charts 400 and 500, and records the generated table information 600 to the memory circuit 44. FIG. 6 shows the table information containing the EA modulator temperatures TEA (T1 to Tn) and the EA bias voltage setting values (V1 to Vn) corresponding thereto for each of the extinction ratios ER1 to ER3.

As a functional structure for acquiring the numerical value data group of the characteristic chart 400 shown in FIG. 4, the table generation processing unit 84 has a processing function which measures the extinction ratio while changing the EA modulator temperature, and samples and acquires the values thereof for each of a plurality of the EA biases.

Further, as a functional structure for acquiring the numerical value data group of the characteristic chart 500 shown in FIG. 5, the table generation processing unit 84 has a processing function which generates the characteristic chart 500 shown in FIG. 5 by using the numerical value data group of the characteristic chart 400 shown in FIG. 4. As the processing function for generating the characteristic chart 500, the table generation processing unit 84 may have a function which measures the extinction ratio while changing the EA bias voltage, and samples and acquires the values thereof for each of a plurality of the EA modulator temperatures. Further, the table generation processing unit 84 has a processing function which generates values other than those of the sampling pointes with the approximate interpolation and acquires a still more detailed characteristic curve when generating the characteristic chart 400.

When generating the table information based on the characteristic charts 400 and 500, the table generation processing unit 84 has a processing function which selects the extinction ratio, and acquires the EA bias voltage corresponding to the EA bias temperature (TEA) under a condition of the selected extinction ratio (ER) based on the numerical value data of the characteristic chart 400.

Further, the table generation processing unit 84 has a processing function which checks the combination of the EA bias voltage and the EA modulator temperature (TEA) falling within the range of the EA modulator temperature (TEA) under the set extinction ratio (ER) based on the numerical value data of the characteristic charts, and adds the correspondence to the table information 600. Further, the table generation processing unit 84 has a processing function which puts the correspondence between the EA bias voltages and the EA modulator temperatures (TEA) into a table, and records it to the memory circuit 44.

In FIG. 2, the control circuit 14 includes an LD output control unit 86 as the structure for adjusting the output intensity of the laser beam. The LD output control unit 86 has a function which controls the LD drive circuit 30 to adjust the intensity of the laser beam outputted from the laser diode (LD) 20 (FIG. 1) to the intensity set in advance based on the light intensity detected by the light output intensity detection processing unit 82, and the LD drive circuit 30 adjusts the drive current for driving the laser diode 20 to emit the light according to the control.

(Actions of Table Information Generation Processing)

Now, actions of the table information 600 generation processing will be described by referring to FIG. 8. First, the control circuit 14 varies the temperature of the EA modulator 22 by controlling the thermoelectric cooler 24 to the direction of heating from cooling, for example. In this case, in order to perform sufficient heating and cooling, it is possible to change the temperature of the environment for placing the EA modulator 22 as necessary and to forcibly cool and heat the EA modulator 22 from outside.

Under a state where the EA modulator temperature (TEA) is changed as described above, the table generation processing unit 84 supplies a plurality of EA bias voltages to the EA modulator 22, and measures the extinction ratio (ER) at each of the EA modulator temperatures. In this manner, values showing the characteristic curves A of the EA modulator temperatures (TEA) with respect to the extinction ratios (ER) can be acquired for each of the plurality of the EA bias voltages (FIG. 8: step S800).

Figure 8:
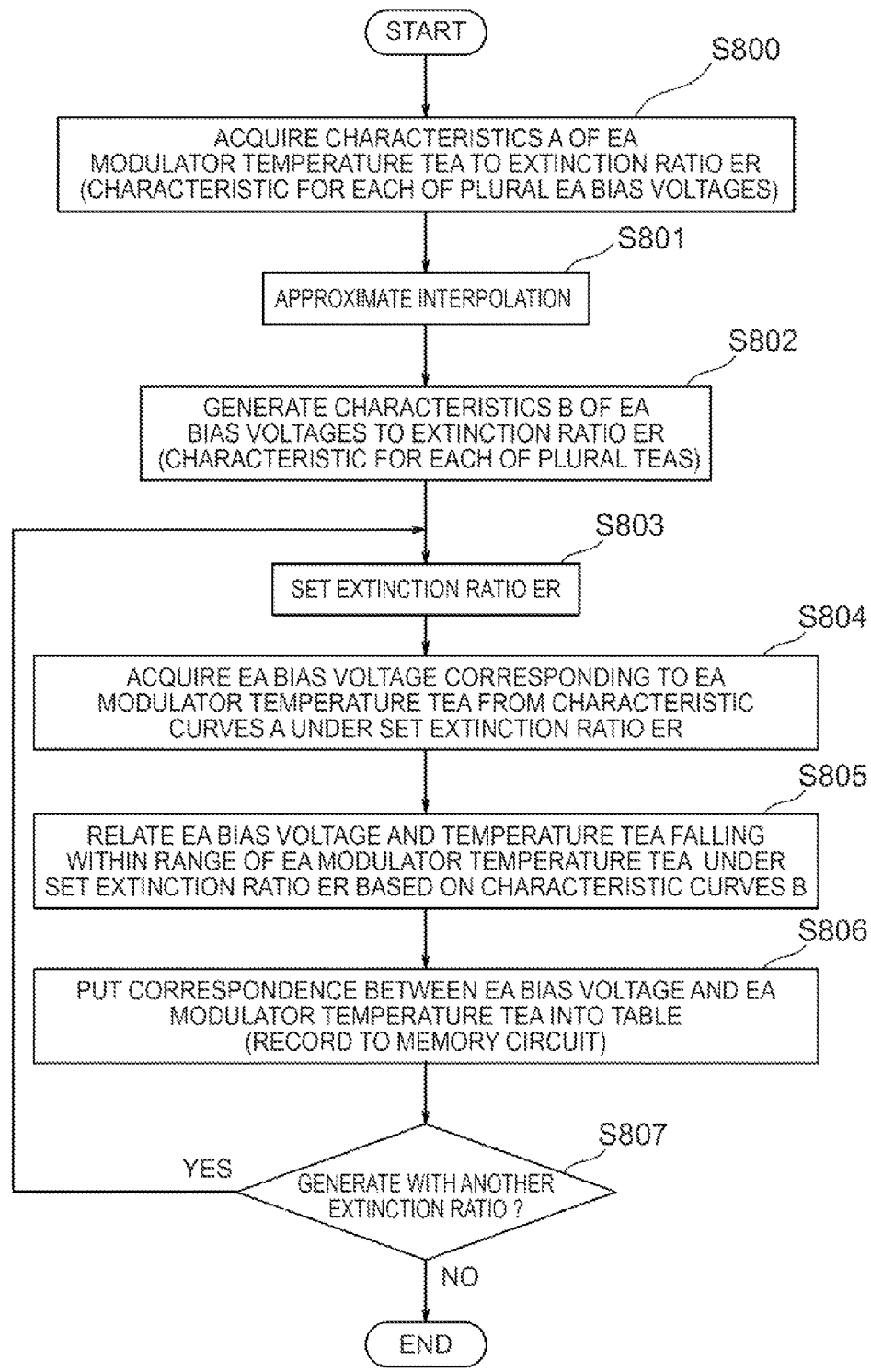
FIG. 8 is a flowchart showing the procedure of table information generation processing according to the exemplary embodiment.

When the values showing the characteristic curves A are acquired, the table generation processing unit 84 performs approximate interpolation by using the values of the sampling points, and further calculates the values other than those of the sampling points (FIG. 8: step S801). In this manner, the characteristic curves A (FIG. 4) for each of the plurality of EA bias voltages can be acquired.

Then, the table generation processing unit 84 generates the characteristic curves B of the EA bias voltages with respect to the extinction ratios (ER) based on the values showing the characteristic curves A. In this manner, the characteristic curves B regarding the plurality of EA modulator temperatures are generated (FIG. 8: step S802).

Then, the table generation processing unit 84 selects and sets a specific extinction ratio (FIG. 8: step S803), and acquires the EA bias voltage corresponding to the EA bias temperature (TEA) under a condition of the set extinction ratio (ER) from the numerical value data showing the characteristic curves A (FIG. 8: step S804). For example, when the extinction ratio (ER) is selected as −5 dB, on the characteristic curves A shown in FIG. 4, the bias voltages V1 and V3 of the curves V3 and V1 corresponding to the extinction ratio are acquired along with each of the corresponding values of 7 degrees centigrade and 64 degrees centigrade of the EA modulator temperatures (TEA).

Further, the table generation processing unit 84 associates the EA bias voltage to the EA modulator temperature (TEA) falling within the range of the EA modulator temperature (TEA) under the set extinction ratio (ER) based on the characteristic curves B (FIG. 5) (FIG. 8: step S805). Here, as the range 502 shown in FIG. 5, the EA bias voltages V1 to V3 and the values of the EA modulator temperatures (TEA) when those voltages are acquired are associated with each other, since the range 502 is included inside the range T1 to T4 where the extinction ratio is −5 dB.

Then, the table generation processing unit 84 puts the associated EA bias voltages and EA modulator temperatures (TEA) into a table, and records it to the memory circuit 44 as the table information 600 (FIG. 8: step S806).

It is then judged whether or not to further generate a table regarding another extinction ratio (FIG. 8: step S807). When judged to generate the table, a value of another desired extinction ratio is set (FIG. 8: step S803) and processing thereafter is executed.

In the manner described above, the table information 600 corresponding to a plurality of extinction ratios is generated in the memory circuit 44.

The processing for generating the table information 600 may be executed at the time of manufacturing the optical transmitter 16, for example, or may be executed as necessary at the time of operating the product after the product is being shipped, etc.

(Temperature Control and Output Control Actions of Optical Transmission/Reception Device)

Next, actions of the optical transmission/reception device according to the exemplary embodiment will be described hereinafter by referring to FIG. 9.

Figure 9:
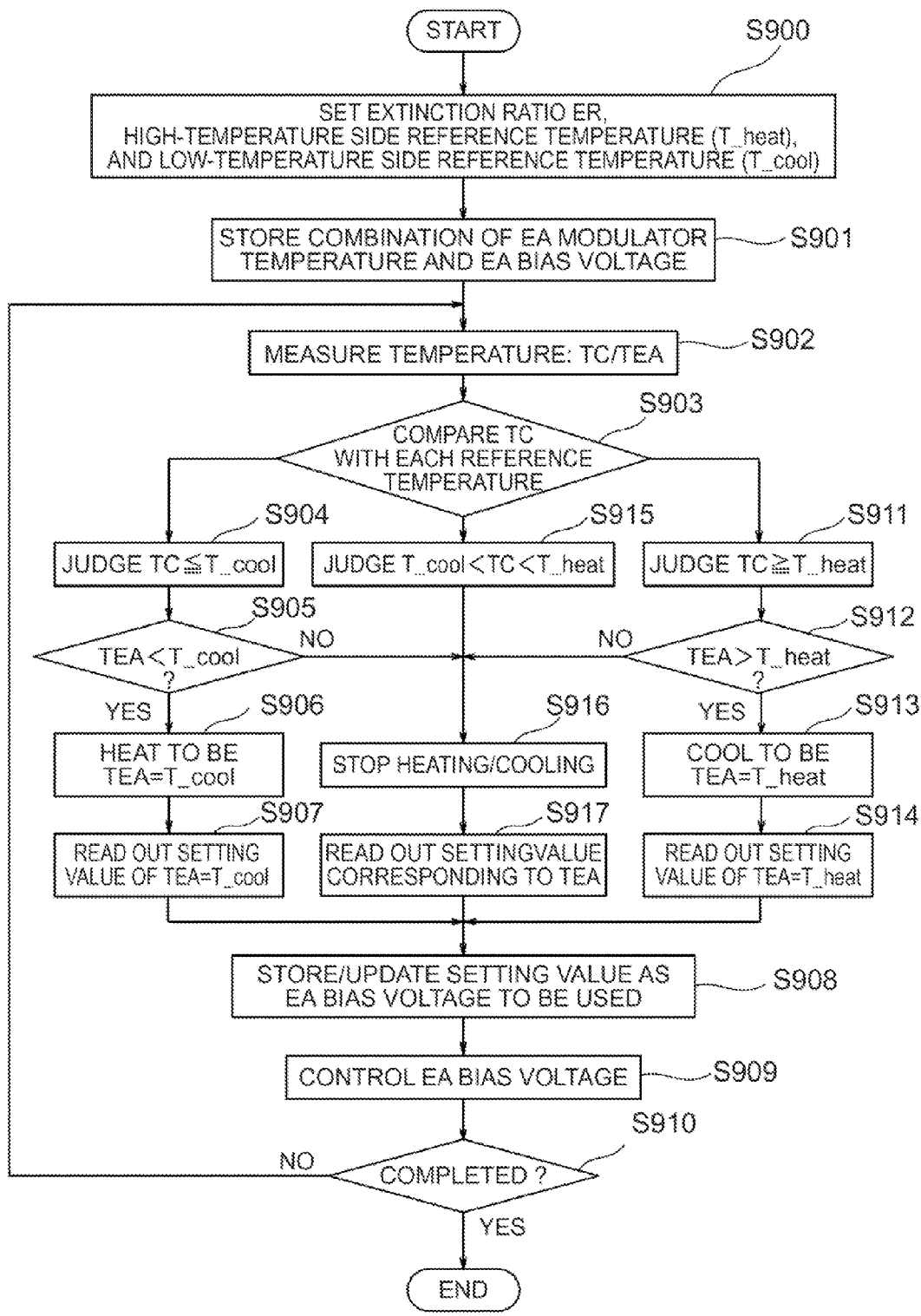
FIG. 9 is a flowchart showing the procedure of temperature control processing and light output control processing according to the exemplary embodiment.

First, an extinction ratio ER1, for example, is set as a desired extinction ratio by the extinction ratio setting processing unit 70, the high-temperature side reference temperature (T_heat) is set by the high-temperature side reference temperature setting processing unit 54, and the low-temperature side reference temperature (T_cool) is set by the low-temperature side reference temperature setting processing unit (FIG. 9: step S900).

Then, the setting value input processing unit 72 reads out the combination content of the EA modulator temperatures (TEA) and the EA bias voltage setting values contained in the table information 600 corresponding to the set extinction ratio ER1 from the memory circuit 22, and the combination saving processing unit 74 temporarily stores the read out content to the internal memory 46 inside the control circuit 14 (step S901).

Then, the casing temperature (TC) and the EA modulator temperature (TEA) are measured, respectively (FIG. 9: step S902), and the casing temperature (TC) is compared with the high-temperature side and low-temperature side reference temperatures (T_cool, T_heat), respectively (step S903).

When judged as a result of the comparison that the casing temperature is equal to or lower than the low-temperature side reference temperature (T_cool) (TC≤T_cool) (FIG. 9: step S904/an equal-to-or-lower-than low-temperature side reference temperature judging step), it is compared whether or not the EA modulator temperature is lower than the low-temperature side reference temperature (TEA<T_cool) (FIG. 9: step S905).

When the EA modulator temperature is lower than the low-temperature side reference temperature (TEA<T_cool), the temperature control judgment processing unit 62 performs a heating control on the thermoelectric cooler 24 to radiate the heat so that the EA modulator temperature (TEA) becomes the low-temperature side reference temperature (T_cool) (FIG. 9: step S906/a heating control step).

Then, the setting value of the EA bias voltage having EA modulator temperature (TEA) that is the same value as the value of the low-temperature side reference temperature (T_cool) is read out from the internal memory 46 by a function of the setting value readout processing unit 76 (FIG. 9: step S907). The read out setting value is stored in the internal memory 46 as the EA bias voltage value to be used currently, the information within the internal memory 46 is updated to the latest information, and the bias voltage setting processing unit 80 performs a control to generate the updated EA bias voltage value (FIG. 9: S908, S909/a low-temperature side bias setting step).

Then, end judgment processing is performed. When judged to continue the actions, the procedure is returned to the processing for measuring the casing temperature (TC) and the EA modulator temperature (TEA) (FIG. 9: step S902) to execute the processing thereafter.

Then, when judged that the casing temperature is equal to or higher than the high-temperature side reference temperature (TC≥T_heat) (FIG. 9: step S911/a step of judging equal to or higher than high-temperature side reference temperature) as a result of the comparison of the casing temperature with the preset low-temperature side and high-temperature side reference temperatures (T_cool, T_heat), respectively, (FIG. 9: step S903/a comparison step), it is compared whether or not the EA modulator temperature (TEA) is higher than the high-temperature side reference temperature (T_heat) (FIG. 9: step S912).

When the EA modulator temperature is higher than the high-temperature side reference temperature (T_heat), the temperature control judgment processing unit 62 performs a cooling control on the thermoelectric cooler 24 to absorb the heat so that the EA modulator temperature (TEA) becomes the high-temperature side reference temperature (T_heat) (FIG. 9: step S913/a cooling control step).

Then, the setting value of the EA bias voltage having EA modulator temperature (TEA) that is the same value as the value of the high-temperature side reference temperature (T_heat) is read out from the internal memory 46 by a function of the setting value readout processing unit 76 (step S914). Then, the setting value read out by the setting value readout processing unit 76 from the internal memory 46 is stored in the internal memory 46 as the EA bias voltage value to be used currently, the information within the internal memory 46 is updated to the latest Is information, and the bias voltage setting processing unit 80 performs a control to generate the updated EA bias voltage value (FIG. 9: S908, S909/a high-temperature side bias setting step).

Then, end judgment processing is performed. When judged to continue the actions, the procedure is returned to the processing for measuring the casing temperature (TC) and the EA modulator temperature (TEA) (FIG. 9: step S902) to execute the processing thereafter.

Then, when it is judged that the casing temperature is higher than the low-temperature side reference temperature and the high-temperature side reference temperature is higher than the casing temperature (T_cool<TC<T_heat) (FIG. 9: step S915/a temperature judging step) as a result of the comparison of the casing temperature with the preset low-temperature side and high-temperature side reference temperatures, respectively, (FIG. 9: step S903), control of the temperature control judgment processing unit 62 is executed to stop heating when the heating control is being executed and, inversely, to stop cooling when the cooling control is being executed (FIG. 9: step S916).

The stop controls are also performed, respectively, in a case where it is judged in step S905 and step S912 described above as negative (No), i.e., in a case where the EA modulator temperature (TEA) is equal to or higher than the low-temperature side reference temperature (T_cool) and in a case where the EA modulator temperature (TEA) is equal to or lower than the high-temperature side reference temperature (T_heat) (FIG. 9: step S916).

Then, the setting value of the EA bias voltage corresponding to the EA modulator temperature (TEA) is read out from the internal memory 46 by the setting value readout processing unit 76 (FIG. 9: step S917).

Thereafter, as described above, the value held in the internal memory 46 is updated by taking the read out setting value as the EA bias voltage value to be used currently (FIG. 9: step S908), and the bias voltage setting processing unit 80 performs a control to generate the updated EA bias voltage value (FIG. 9: step S909).

Further, end judgment processing is performed. When judged to continue the actions, the procedure is returned to the processing for measuring the casing temperature (TC) and the EA modulator temperature (TEA) (FIG. 9: step S902) to execute the processing thereafter.

For the temperature control and the light output control of the embodiment described above, it is also possible to employ a feed forward control which performs the control by predicting the temperature change, other than performing a feedback control which performs the control after detecting the changes in each temperature.

Note here that the each execution content executed in each of the steps of the actions of the embodiment described above may be put into a program and cause a computer to execute the program. In that case, the program may be recorded to be readable in a non-transitory recording medium such as a DVD (trademark), a CD (trademark), or a flash memory. In that case, the program is read out by the computer from the recording medium, and executed.

(Effects of Embodiments)

As described above, with the optical transmission/reception device 10 of the embodiment, the control circuit 14 generates in advance the setting values with which a desired extinction ratio can be acquired by using the EA modulator temperatures and the EA bias voltages as the table information 600 (FIG. 6) in the memory circuit 44, and executes the temperature control and the output control for the EA modulator 22 based on the generated table information 600. Thus, it is possible to cut the power consumption in the range 304 (FIG. 3) from the low-temperature side reference temperature to the high-temperature side reference temperature. Further, it is possible to stabilize the output of the EA modulator 22 by setting the EA bias voltage according to the temperature of the EA modulator 22 within the range 304.

Further, in the ranges 300 and 303 (FIG. 3) where the casing temperature is equal to or lower than the low-temperature side reference temperature and where the casing temperature is equal to or higher than the high-temperature side reference temperature, it is possible to set the temperature of the EA modulator constant by heating or cooling the EA modulator 22 for the respective case and to stabilize the output of the EA modulator 22 by supplying the bias voltage set in advance to the EA modulator 22 for the respective case.

As a result of such actions, it becomes possible to acquire a fine light output property under a condition of a wide range of temperatures and to cut the power consumption greatly.

As an exemplary advantage according to the invention, the present invention makes it possible to have a temperature range set in advance, to reduce the power consumption within the set temperature range, and to acquire the light output of a preset extinction ratio in a wide temperature range.

Therefore, it is possible to provide the excellent optical transmission device, optical transmission/reception device, control method, and control program, which can acquire a fine light output property of the optical signals to be outputted.

While the present invention has been described above by referring to each of the exemplary embodiments, the present invention is not limited only to each of those exemplary embodiments. Various changes and modifications occurred to those skilled in the art can be applied to the structures and details of the present invention. Further, the present invention includes combinations of a part of or a whole part of the structures of each of the above-described embodiments.

The whole or part of the exemplary embodiments disclosed above can be described as, but not limited to, the following Supplementary Notes.

(Supplementary Note 1)

An optical transmission device, which includes: an Optical transmission unit which includes a light source that emits a laser beam, a modulator that modulates the laser beam, a modulator temperature detection element that detects a modulator temperature of the modulator, and a temperature control element that has functions of heating and cooling the modulator to execute a temperature control; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, wherein the main control unit includes: a function which functions when the casing temperature is within a range of a low-temperature side reference temperature and a high-temperature side reference temperature set in advance so as to stop each control action regarding heating and cooling of the temperature control element for the modulator; a function which functions when the casing temperature is equal to or lower than the low-temperature side reference temperature so as to execute a heating control of the temperature control element and to set the bias voltage corresponding to the low-temperature side reference temperature to the modulator based on the table information; and a function which functions when the casing temperature is equal to or higher than the high-temperature side reference temperature so as to execute a cooling control of the temperature control element and to set the bias voltage corresponding to the high-temperature side reference temperature to the modulator based on the table information.

(Supplementary Note 2)

The optical transmission device depicted in Supplementary Note 1, wherein the main control unit includes a function which functions when the casing temperature is within a range of the low-temperature side reference temperature and the high-temperature side reference temperature so as to set the bias voltage for the modulator to the bias voltage corresponding to the modulator temperature based on the table information.

(Supplementary Note 3)

The optical transmission device depicted in Supplementary Note 1, wherein the table information is information generated by setting an extinction ratio specified in advance in accordance with a purpose of using the modulator and generated based on a correspondence between the modulator temperature and the bias voltage with which the extinction ratio can be acquired.

(Supplementary Note 4)

The optical transmission device depicted in Supplementary Note 3, wherein the main control unit includes in advance a table generation processing unit which generates the table information and records the information to the memory unit.

(Supplementary Note 5)

The optical transmission device depicted in Supplementary Note 1, wherein the main control unit includes a stop judgment control function which: functions when the casing temperature is equal to or lower than the low-temperature side reference temperature and the temperature control element is under the heating control, and executes a stop control of the heating control when the modulator temperature is equal to or higher than the low-temperature side reference temperature; and functions when the casing temperature is equal to or higher than the high-temperature side reference temperature and the temperature control element is under the cooling control, and executes a stop control of the cooling control when the modulator temperature is equal to or lower than the high-temperature side reference temperature.

(Supplementary Note 6)

An optical transmission/reception device which includes the optical transmission device depicted in one of Supplementary Notes 1 to 5 and an optical reception device which receives an optical signal transmitted via an optical fiber.

(Supplementary Note 7)

An optical transmission device action control method used for an optical transmission device including an optical transmission unit which includes a light source that emits a laser beam, a modulator that modulates the laser beam, a modulator temperature detection element that detects a modulator temperature of the modulator, and a temperature control element that has functions of heating and cooling the modulator to control the temperature; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, and the method includes: when the casing temperature detected by the casing temperature detection element is within a range of a low-temperature side reference temperature and a high-temperature side reference temperature set in advance (a temperature judging step), stopping each control action regarding heating and cooling of the temperature control element for the modulator (a heating/cooling stopping step); when the casing temperature is equal to or lower than the low-temperature side reference temperature (an equal-to-or-lower-than low-temperature side reference temperature judging step), executing a heating control of the temperature control element so that the modulator temperature becomes the low-temperature side reference temperature (a heating control step) and setting the bias voltage corresponding to the low-temperature side reference temperature to the modulator based on the table information (a low-temperature side bias setting step); and when the casing temperature is equal to or higher than the high-temperature side reference temperature (an equal-to-or-higher-than high-temperature side reference temperature judging step), executing a cooling control of the temperature control element so that the modulator temperature becomes the high-temperature side reference temperature (a cooling control step) and setting the bias voltage corresponding to the high-temperature side reference temperature to the modulator based on the table information (a high-temperature side bias setting step), wherein each of setting control actions is executed by the main control unit in order.

(Supplementary Note 8)

The optical transmission device action control method depicted in Supplementary Note 7, wherein when the casing temperature is within a range of the low-temperature side reference temperature and the high-temperature side reference temperature set in advance (a temperature judging step), the main control unit sets the bias voltage for the modulator to the bias voltage corresponding to the modulator temperature based on the table information (an in-temperature-range bias voltage setting step).

(Supplementary Note 9)

The optical transmission device action control method depicted in Supplementary Note 7, which includes: setting an extinction ratio specified in advance in accordance with a purpose of using the modulator and generating the table information based on a correspondence between the modulator temperature and the bias voltage with which the extinction ratio can be acquired (a table generation processing step).

(Supplementary Note 10)

A recording medium nontemporarily recording an optical transmission device action control program that causes a computer, which is provided to a main control unit of an optical transmission device including an optical transmission unit that includes a light source that emits a laser beam, a modulator that modulates the laser beam, a modulator temperature detection element that detects a modulator temperature of the modulator, and a temperature control element that has functions of heating and cooling the modulator to control the temperature; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, to execute: an in-temperature-range judging function which judges that the casing temperature detected by the casing temperature detection element is within a temperature range of a low-temperature side reference temperature and a high-temperature side reference temperature set in advance; a heating/cooling stop control function which functions when the casing temperature is within the temperature range so as to stop each control action regarding heating and cooling of the temperature control element for the modulator; an equal-to-or-lower-than low-temperature side reference temperature judging function which judges that the casing temperature is equal to or lower than the low-temperature side reference temperature; an equal-to-or-lower-than low-temperature side reference temperature heating function which functions when the casing temperature is equal to or lower than the low-temperature side reference temperature so as to execute a heating control of the temperature control element; a low-temperature side bias setting function which functions when the casing temperature is equal to or lower than the low-temperature side reference temperature so as to set the bias voltage corresponding to the low-temperature side reference temperature to the modulator based on the table information; an equal-to-or-higher-than high-temperature side reference temperature judging function which judges that the casing temperature is equal to or higher than the high-temperature side reference temperature; an equal-to-or-higher-than high-temperature side reference temperature cooling function which functions when the casing temperature is equal to or higher than the high-temperature side reference temperature so as to execute a cooling control of the temperature control element; and a high-temperature side bias setting function which functions when the casing temperature is equal to or higher than the high-temperature side reference temperature so g to set the bias voltage corresponding to the high-temperature side reference temperature to the modulator based on the table information.

(Supplementary Note 11)

The recording medium nontemporarily recording the optical transmission device action control program depicted in Supplementary Note 10, which causes the computer to execute: an in-temperature-range bias voltage setting function which functions when the casing temperature is within the temperature range so as to set the bias voltage for the modulator to the bias voltage corresponding to the modulator temperature based on the table information.

(Supplementary Note 12)

The recording medium nontemporarily recording the optical transmission device action control program depicted in Supplementary Note 10, which causes the computer to execute a table generation processing function that sets an extinction ratio specified in advance in accordance with a purpose of using the modulator and generates the table information based on a correspondence between the modulator temperature and the bias voltage with which the extinction ratio can be acquired.

What is claimed is:

1. An optical transmission device, comprising:
    an optical transmission unit which includes a light source that emits a laser beam, a modulator that modulates the laser beam, a modulator temperature detection element that detects a modulator temperature of the modulator, and a temperature control element that has functions of heating and cooling the modulator to execute a temperature control; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, wherein
    the main control unit includes:
    a function which functions when the casing temperature is within a range of a low-temperature side reference temperature and a high-temperature side reference temperature set in advance so as to stop each control action regarding heating and cooling of the temperature control element for the modulator;
    a function which functions when the casing temperature is equal to or lower than the low-temperature side reference temperature so as to execute a heating control of the temperature control element and to set the bias voltage corresponding to the low-temperature side reference temperature to the modulator based on the table information; and
    a function which functions when the casing temperature is equal to or higher than the high-temperature side reference temperature so as to execute a cooling control of the temperature control element and to set the bias voltage corresponding to the high-temperature side reference temperature to the modulator based on the table information.

2. The optical transmission device as claimed in claim 1, wherein
    the main control unit includes a function which functions when the casing temperature is within a range of the low-temperature side reference temperature and the high-temperature side reference temperature so as to set the bias voltage for the modulator to the bias voltage corresponding to the modulator temperature based on the table information.

3. The optical transmission device as claimed in claim 1, wherein the table information is information generated by setting an extinction ratio specified in advance in accordance with a purpose of using the modulator and generated based on a correspondence between the modulator temperature and the bias voltage with which the extinction ratio can be acquired.

4. The optical transmission device as claimed in claim 3, wherein
the main control unit includes in advance a table generation processing unit which generates the table information and records the information to the memory unit.

5. The optical transmission device as claimed in claim 1, wherein
the main control unit includes a stop judgment control function which:
functions when the casing temperature is equal to or lower than the low-temperature side reference temperature and the temperature control element is under the heating control, and executes a stop control of the heating control when the modulator temperature is equal to or higher than the low-temperature side reference temperature; and
functions when the casing temperature is equal to or higher than the high-temperature side reference temperature and the temperature control element is under the cooling control, and executes a stop control of the cooling control when the modulator temperature is equal to or lower than the high-temperature side reference temperature.

6. An optical transmission/reception device, comprising
the optical transmission device of claim 1 and an optical reception device which receives an optical signal transmitted via an optical fiber.

7. An optical transmission device action control method used for an optical transmission device comprising an optical transmission unit which includes a light source that emits a laser beam, a modulator that modulates the laser beam, a modulator temperature detection element that detects a modulator temperature of the modulator, and a temperature control element that has functions of heating and cooling the modulator to control the temperature; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, the method comprising:
when the casing temperature detected by the casing temperature detection element is within a range of a low-temperature side reference temperature and a high-temperature side reference temperature set in advance, stopping each control action regarding heating and cooling of the temperature control element for the modulator;
when the casing temperature is equal to or lower than the low-temperature side reference temperature, executing a heating control of the temperature control element so that the modulator temperature becomes the low-temperature side reference temperature and setting the bias voltage corresponding to the low-temperature side reference temperature to the modulator based on the table information; and
when the casing temperature is equal to or higher than the high-temperature side reference temperature, executing a cooling control of the temperature control element so that the modulator temperature becomes the high-temperature side reference temperature and setting the bias voltage corresponding to the high-temperature side reference temperature to the modulator based on the table information, wherein
each of setting control actions is executed by the main control unit in order.

8. The optical transmission device action control method as claimed in claim 7, wherein
when the casing temperature is within a range of the low-temperature side reference temperature and the high-temperature side reference temperature set in advance, the main control unit sets the bias voltage for the modulator to he bias voltage corresponding to the modulator temperature based on the table information.

9. A non-transitory computer readable recording medium storing an optical transmission device action control program that causes a computer, which is provided to a main control unit of an optical transmission device comprising an optical transmission unit that includes a light source that emits a laser beam, a modulator that modulates the laser beam, a modulator temperature detection element that detects a modulator temperature of the modulator, and a temperature control element that has functions of heating and cooling the modulator to control the temperature; a main control unit that controls actions of each section of the optical transmission unit; a memory unit that records table information generated in advance for setting a bias voltage for the modulator; a casing that houses the optical transmission unit, the main control unit, and the memory unit; and a casing temperature detection element that detects a casing temperature of the casing, to execute:
an in-temperature-range judging function which judges that the casing temperature detected by the casing temperature detection element is within a temperature range of a low-temperature side reference temperature and a high-temperature side reference temperature set in advance;
a heating/cooling stop control function which functions when the casing temperature is within the temperature range so as to stop each control action regarding heating and cooling of the temperature control element for the modulator;
an equal-to-or-lower-than low-temperature side reference temperature judging function which judges that the casing temperature is equal to or lower than the low-temperature side reference temperature;
an equal-to-or-lower-than low-temperature side reference temperature heating function which functions when the casing temperature is equal to or lower than the low-temperature side reference temperature so as to execute a heating control of the temperature control element;
a low-temperature side bias setting function which functions when the casing temperature is equal to or lower than the low-temperature side reference temperature so as to set the bias voltage corresponding to the low-temperature side reference temperature to the modulator based on the table information;
an equal-to-or-higher-than high-temperature side reference temperature judging function which judges that the casing temperature is equal to or higher than the high-temperature side reference temperature;
an equal-to-or-higher-than high-temperature side reference temperature cooling function which functions when the casing temperature is equal to or higher than the high-temperature side reference temperature so as to execute a cooling control of the temperature control element; and a high-temperature side bias setting function which functions when the casing temperature is equal to or higher than the high-temperature side reference temperature so as to set the bias voltage corresponding to the high-temperature side reference temperature to the modulator based on the table information.

10. The non-transitory computer readable recording medium storing the optical transmission device action control program of claim which causes the computer to execute:
an in-temperature-range bias voltage setting function which functions when the casing temperature is within the temperature range so as to set the bias voltage for the modulator to the bias voltage corresponding to the modulator temperature based on the table information.

11. An optical transmission device, comprising:
an optical transmission unit which includes light source means for emitting a laser beam, modulator means for modulating the laser beam, modulator means temperature detection means for detecting a modulator means temperature of the modulator means, and temperature control means for heating and cooling the modulator means to execute a temperature control; main control means for controlling actions of each section of the optical transmission unit; memory means for recording table information generated in advance for setting a bias voltage for the modulator means; a casing that houses the optical transmission unit, the main control means, and the memory means; and casing temperature detection means for detecting a casing temperature of the casing, wherein the main control means includes:

a function which functions when the casing temperature is within a range of a low-temperature side reference temperature and a high-temperature side reference temperature set in advance so as to stop each control action regarding heating and cooling of the temperature control means for the modulator means;

a function which functions when the casing temperature is equal to or lower than the low-temperature side reference temperature so as to execute a heating control of the temperature control means and to set the bias voltage corresponding to the low-temperature side reference temperature to the modulator means based on the table information; and a function which functions when the casing temperature is equal to or higher than the high-temperature side reference temperature so as to execute a cooling control of the temperature control means and to set the bias voltage corresponding to the high-temperature side reference temperature to the modulator means based on the table information.

* * * * *